United States Patent
Meyer et al.

(10) Patent No.: US 11,171,066 B2
(45) Date of Patent: Nov. 9, 2021

(54) SEMICONDUCTOR PANELS, SEMICONDUCTOR PACKAGES, AND METHODS FOR MANUFACTURING THEREOF

(71) Applicant: Infineon Technologies AG, Neubiberg (DE)

(72) Inventors: Thorsten Meyer, Regensburg (DE); Andreas Grassmann, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 54 days.

(21) Appl. No.: 16/690,963

(22) Filed: Nov. 21, 2019

(65) Prior Publication Data
US 2020/0203238 A1   Jun. 25, 2020

(30) Foreign Application Priority Data
Dec. 21, 2018  (DE) ............... 10 2018 133 344.7

(51) Int. Cl.
*H01L 23/055* (2006.01)
*H01L 21/48* (2006.01)
*H01L 21/52* (2006.01)
*H01L 23/08* (2006.01)

(52) U.S. Cl.
CPC .......... *H01L 23/055* (2013.01); *H01L 21/486* (2013.01); *H01L 21/52* (2013.01); *H01L 23/08* (2013.01)

(58) Field of Classification Search
CPC ..................................................... H01L 23/055
See application file for complete search history.

(56) References Cited

U.S. PATENT DOCUMENTS

| | | | |
|---|---|---|---|
| 4,855,868 A | 8/1989 | Harding | |
| 6,177,040 B1 * | 1/2001 | Dennis | B29C 43/18 257/E21.504 |
| 8,178,963 B2 | 5/2012 | Yang | |
| 2005/0179102 A1 | 8/2005 | Weiblen et al. | |
| 2008/0197469 A1 | 8/2008 | Yang et al. | |
| 2009/0186446 A1 * | 7/2009 | Kwon | H01L 23/055 438/107 |
| 2018/0006003 A1 | 1/2018 | Nagarajan et al. | |

FOREIGN PATENT DOCUMENTS

CN   205 069 620   3/2016
CN   106 158 764   11/2016

* cited by examiner

*Primary Examiner* — William A Harriston
(74) *Attorney, Agent, or Firm* — Dicke, Billig & Czaja, PLLC

(57) ABSTRACT

A method for manufacturing a semiconductor panel is disclosed. In one example, the method includes providing a first preformed polymer form. The method further includes arranging multiple semiconductor chips over the first preformed polymer form. The method further includes attaching a second preformed polymer form to the first preformed polymer form, wherein the semiconductor chips are arranged between the attached preformed polymer forms, and wherein the attached preformed polymer forms form the semiconductor panel encapsulating the semiconductor chips.

20 Claims, 5 Drawing Sheets

SEMICONDUCTOR PANELS, SEMICONDUCTOR PACKAGES, AND METHODS FOR MANUFACTURING THEREOF

CROSS-REFERENCE TO RELATED APPLICATION

This Utility Patent Application claims priority to German Patent Application No. 10 2018 133 344.7, filed Dec. 21, 2018, which is incorporated herein by reference.

TECHNICAL FIELD

The present disclosure generally relates to semiconductor technology. In particular, the present disclosure relates to semiconductor panels, semiconductor packages, and methods for manufacturing thereof.

BACKGROUND

Semiconductor devices may be manufactured in form of semiconductor packages, i.e. metal, plastic, glass, or ceramic casings containing one or more semiconductor electronic components. The cost of packaging can be seen as one of the major drivers for the semiconductor industry. The design and production of power semiconductor packages may impose specific requirements. For example, conducting paths in power packages may need to be designed for properly handling occurring high currents. Manufacturers of semiconductor devices are constantly striving to improve their products and methods for manufacturing thereof. It may thus be desirable to develop methods for manufacturing semiconductor devices that provide an improved and cost-efficient production of the devices and that may be particularly suited for the production of power semiconductor packages.

SUMMARY

An aspect of the present disclosure relates to a method for manufacturing a semiconductor panel. The method comprises providing a first preformed polymer form. The method further comprises arranging multiple semiconductor chips over the first preformed polymer form. The method further comprises attaching a second preformed polymer form to the first preformed polymer form, wherein the semiconductor chips are arranged between the attached preformed polymer forms, and wherein the attached preformed polymer forms form the semiconductor panel encapsulating the semiconductor chips.

A further aspect of the present disclosure relates to a semiconductor package. The semiconductor package comprises a first preformed polymer form. The semiconductor package further comprises a second preformed polymer form attached to the first preformed polymer form. The semiconductor package further comprises a semiconductor chip arranged between the attached preformed polymer forms, wherein the attached preformed polymer forms form a semiconductor package encapsulating the semiconductor chip.

BRIEF DESCRIPTION OF THE DRAWINGS

The accompanying drawings are included to provide a further understanding of aspects and are incorporated in and constitute a part of this description. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DESCRIPTION OF EMBODIMENTS

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figure 1A:
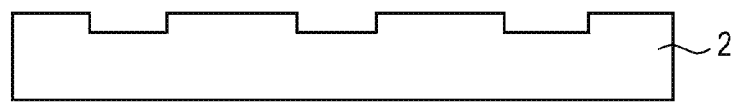
FIG. 1 includes FIGS. 1A to 1C schematically illustrating a cross-sectional side view of a method for manufacturing a semiconductor panel 100 in accordance with the disclosure.
Figure 1B:
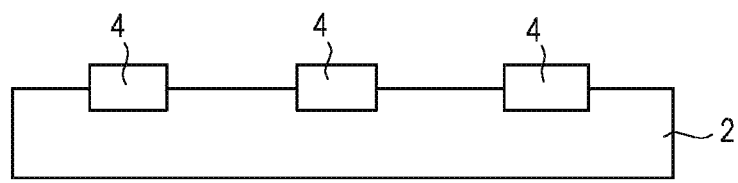
Figure 1C:
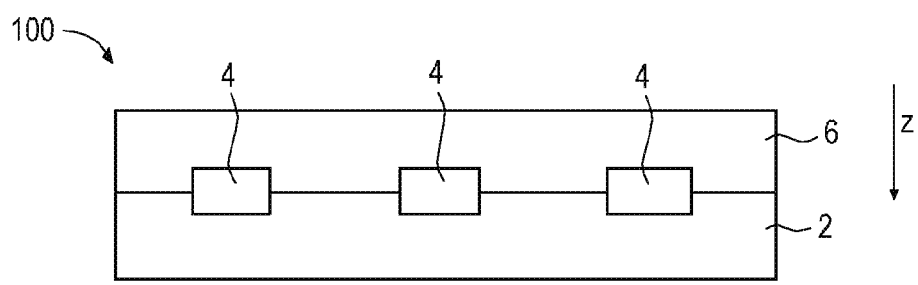

FIG. 1 includes FIGS. 1A to 1C schematically illustrating a cross-sectional side view of a method for manufacturing a semiconductor panel 100 in accordance with the disclosure. The method of FIG. 1 is illustrated in a general manner in order to qualitatively specify aspects of the disclosure. The method may include further aspects which are not illustrated for the sake of simplicity. For example, the method may be extended by any of the aspects described in connection with other methods and devices in accordance with the disclosure.

In FIG. 1A, a first preformed polymer form 2 is provided. In the example of FIG. 1A, the first preformed polymer form 2 may include multiple recesses in which multiple semiconductor chips may be arranged later on. In further examples, the first preformed polymer form 2 may be of different shape. For example, a surface of the first preformed polymer form 2 for mounting semiconductor chips later on may be substantially planar. In addition, the number of shown recesses in FIG. 1A is exemplary and may differ in further examples.

In FIG. 1B, multiple semiconductor chips 4 are arranged over the first preformed polymer form 2. In the example of FIG. 1B, the semiconductor chips 4 may be arranged in the recesses. In further examples, the semiconductor chips 4 may be additionally or alternatively arranged over a planar surface of the first preformed polymer form 2.

In FIG. 1C, a second preformed polymer form 6 is attached to the first preformed polymer form 2. In the example of FIG. 1C, the preformed polymer forms 2 and 6 may be of similar shape. In further examples, the shapes of the preformed polymer forms 2 and 6 may differ from each other. The semiconductor chips 4 are arranged between the attached preformed polymer forms 2 and 6. The attached preformed polymer forms 2 and 6 form a semiconductor panel 100 encapsulating the semiconductor chips 4.

According to an embodiment arranging the semiconductor chips 4 may include arranging the semiconductor chips 4 in multiple recesses of the first preformed polymer form 2 as exemplarily shown in FIG. 1B. The shape of a recess may be similar to the shape of a semiconductor chip 4 arranged in the recess when view in a z-direction (see arrow in FIG. 1C). For example, a semiconductor chip 4 may be glued to a bottom of the recess so that the opening of the recess may be chosen to be slightly larger than the semiconductor chip 4.

According to an embodiment arranging the semiconductor chips 4 may include arranging electrical contacts of the semiconductor chips 4 over through-holes of the first preformed polymer form 2. An electrical contact of a semiconductor chip 4 may be formed as a contact pad (or a contact element or a contact terminal or a contact electrode) and may provide electrical access to internal circuitry of the semiconductor chip 4. The through-holes may extend from a first surface of the first preformed polymer form 2 to a second surface of the first preformed polymer form 2. The through-holes may be filled with an electrically conductive material later on so that the filled through-holes may provide electrical access to the electrical contacts of the semiconductor chips 4, in particular from an opposite side of the first preformed polymer form 2.

According to an embodiment arranging the electrical contacts may include arranging a first electrical contact of a semiconductor chip 4 over a first through-hole, and arranging a second electrical contact of the semiconductor chip 4 over a second through-hole adjacent to the first through-hole. The first through-hole and the second through-hole may be separated by a separation structure. The opening areas of the through-holes when viewed in the z-direction (see arrow in FIG. 1C) may substantially correspond to the surface areas of the electrical contacts. For example, the semiconductor chip 4 may be a power transistor chip with a gate electrode and a source electrode arranged on a surface of the semiconductor chip 4 facing the first and second through-holes. Here, the gate electrode may be arranged over the first through-hole, and the source electrode may be arranged over the second through-hole. The through-holes filled with an electrically conductive material later on may provide electrical access to the gate electrode and source electrode of the semiconductor chip 4, in particular from an opposite side of the first preformed polymer form 2.

According to an embodiment attaching the second preformed polymer form 6 may include arranging through-holes of the second preformed polymer form 6 over electrical contacts of the semiconductor chips 4. The through-holes may extend from a first surface of the second preformed polymer form 6 to a second surface of the second preformed polymer form 6. The through-holes filled with an electrically conductive material later on may provide electrical access to the electrical contacts, in particular from an opposite side of the second preformed polymer form. For the case of a power transistor chip as explained above, the electrical contacts may correspond to drain electrodes of the semiconductor chips 4.

According to an embodiment the method of FIG. 1 may further include depositing a metallization material into through-holes of at least one of the preformed polymer forms 2 and 6, wherein the deposited metallization material may be electrically coupled to electrical contacts of the semiconductor chips 4. For example, the metallization material may be deposited by applying at least one of the following techniques: cold gas spraying, plasma dust spraying, plasma induced spraying, electro plating, electroless plating, galvanic deposition, vapor deposition, printing, etc.

According to an embodiment depositing the metallization material may include cold gas spraying at least one of a metal and a metal alloy into the through-holes. Cold gas spraying may refer to a coating deposition method in which solid powders may be accelerated in a supersonic gas jet to velocities up to from about 500 m/s to about 1000 m/s. Particles of the accelerated powder may have a diameter from about 1 micrometer to about 50 micrometer. During impact with a target, the particles may undergo plastic deformation and may adhere to a surface of the target. In general, metals, alloys, polymers, ceramics, composite materials, and nanocrystalline powders may be deposited using cold gas spraying. The powders used in cold gas spraying may not necessarily be melted during the spraying process. For example, the metallization material may be deposited by cold gas spraying at least one of copper, aluminum, iron, nickel, alloys thereof. The cold gas sprayed metallization material may have a porosity smaller than about 50%, more particular smaller than about 40%, more particular smaller than about 30%, more particular smaller than about 20%, and even more particular smaller than about 10%. In one example the porosity may lie in a range from about 10% to about 50%. The porosity may be dimensionless and may correspond to the ratio of the void volume to the total volume of the porous material or of the body formed from the porous material. For example, a metallization material manufactured by cold gas spraying may be distinguished from a bulk material layer of the same material.

According to an embodiment the method of FIG. 1 may further include partly removing at least one of the preformed polymer forms 2 and 6 and the metallization material, wherein a surface of at least one of the preformed polymer forms 2 and 6 and a surface of the metallization material may be arranged in a common plane after removing the material. For example, a surface formed by one of the preformed polymer forms 2 and 6 and the metallization material may need to be planarized so that a further material layer may be deposited properly over the formed planar surface. The material may be removed by applying at least one of the following techniques: grinding, chemical mechanical polishing, etching, etc.

According to an embodiment the first preformed polymer form 2 may include a first via hole extending through the first preformed polymer form 2, and the second preformed polymer form 6 may include a second via hole extending through the second preformed polymer form 6. In addition, attaching the second preformed polymer form 6 may include providing an overlap between the first via hole and the second via hole, and the deposited metallization material may form an electrical via connection extending through the semiconductor panel 100. An electric contact on a surface of the semiconductor chip 4 may thus become accessible from a surface of the semiconductor panel 100 arranged opposite to the chip surface. For example, all electrical contacts of a power transistor chip (i.e. gate electrode, source electrode, drain electrode) may thus be arranged on a same surface of a semiconductor package obtained by singulating the semiconductor panel 100.

According to an embodiment the method of FIG. 1 may further include, before attaching the second preformed polymer form 6, arranging an electrically conductive layer over the first preformed polymer form 2, wherein the electrically conductive layer may be arranged between the preformed polymer forms 2 and 6. In particular, the electrically conductive layer may be manufactured from at least one of a metal and a metal alloy, such as e.g. copper, aluminum, alloys thereof. The electrically conductive layer may be fabricated by applying any suitable technique. In one example, the electrically conductive layer may be manufactured by applying at least one of electroless plating, galvanic deposition, vapor deposition, etc. In a further example, the electrically conductive layer may be a preformed metal sheet, such as e.g. a copper sheet or an aluminum sheet, which may be attached, in particular glued, to one of the preformed polymer forms 2 and 6 before the preformed polymer forms 2 and 6 are attached to each other. The electrically conductive layer may have the function of a redistribution layer providing a redistribution of electrical signals of the semiconductor chip 4 and further electronic components of a semiconductor package to be manufactured.

According to an embodiment the method of FIG. 1 may further include forming at least one recess in at least one of the preformed polymer forms 2 and 6, and arranging an electronic component in the at least one recess, wherein the electronic component may be encapsulated in the semiconductor panel 100. For example, the electronic component may include at least one of a passive electronic component (e.g. an integrated passive device (IPD)), an active electric component, a surface mount device (SMD) (e.g. an SMD capacitor), etc. After attaching the preformed polymer forms 2 and 6 to each other, the electronic component may thus particularly be arranged in a cavity of the semiconductor panel 100.

According to an embodiment the electronic component may be electrically coupled to one of the semiconductor chips 4 via the electrically conductive layer. In particular, the electronic component may be glued or soldered to the electrically conductive layer, wherein an electrical connection between an electrical contact of the electronic component and an electrical contact of a semiconductor chip 4 may be established via the electrically conductive layer.

According to an embodiment the semiconductor chips 4 may include power semiconductor chips. The semiconductor chips (or semiconductor dies) 4 may be similar or of different type. In general, the semiconductor chips 4 may include integrated circuits, passive electronic components, active electronic components, etc. In general, the integrated circuits may be designed as logic integrated circuits, analog integrated circuits, mixed signal integrated circuits, power integrated circuits, etc. In one example, the semiconductor chips 4 may be manufactured from an elemental semiconductor material, for example Si, etc. In a further example, the semiconductor chips 4 may be manufactured from a compound semiconductor material, for example GaN, SiC, SiGe, GaAs, etc. In particular, the semiconductor chips 4 may include one or more power semiconductors. Power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), super junction devices, power bipolar transistors, etc. Power semiconductor chips may have a vertical structure, i.e. electrical currents may substantially flow in a direction perpendicular to the main faces of the semiconductor chips. For example, the source electrode and gate electrode of a power MOSFET may be arranged over one face while the drain electrode of the power MOSFET may be arranged over the other face. Power semiconductor chips may have a lateral structure, i.e. electrical currents may substantially flow in a direction parallel to a main face of the semiconductor chips. For example, a gate electrode, a source electrode and a drain electrode of a power MOSFET may be arranged over one main face of a power MOSFET.

According to an embodiment the method of claim 1 may further include structuring at least one of the preformed polymer forms 2 and 6, wherein the structuring comprises at least one of molding, milling, grinding, laser drilling. Molding may include at least one of compression molding, injection molding, powder molding, liquid molding, lamination, printing, etc. In particular, structuring the preformed polymer forms 2 and 6 may be performed before performing the acts of FIG. 1.

According to an embodiment the semiconductor panel 100 may be of rectangular shape, and a surface area of the rectangular semiconductor panel 100 may be greater than or equal to 300 mm×300 mm. The method of FIG. 1 may be considered a panel-level packaging (PLP) technique or fan-out panel-level packaging (FOPLP) technique which may differ from known wafer-level packaging (WLP) techniques and known fan-out wafer-level packaging (FOWLP) techniques. In WLP or FOWLP, the wafer or reconstituted wafer may be of circular shape having a diameter of 200 mm or 300 mm. Compared to WLP and FOWLP, the size of the semiconductor panel may be increased in PLP and FOPLP such that a manufacturer or vendor may be able to process more semiconductor chips (or semiconductor dies) on panel level compared to wafer level. For example a 500 mm×500 mm panel, may process 4.54 times as many semiconductor chips as a 300 mm diameter wafer. This may result in lowered production costs. In particular, the manufactured semiconductor panel 100 may be of rectangular shape when view in the z-direction (see arrow in FIG. 1C). In this view, the semiconductor chips 4 may e.g. be arranged in a periodic and rectangular grid-like structure. In one example, the semiconductor panel 100 may be of 510 mm×515 mm in size. In a further example, the semiconductor panel 100 may be of 600 mm×600 mm in size. In yet a further example, the semiconductor panel 100 may be of 18"×24" (i.e. 457.2 mm×609.6 mm) in size. The number of semiconductor chips 4 embedded in the semiconductor panel 100 may be up to 8000 or more.

Figure 2:
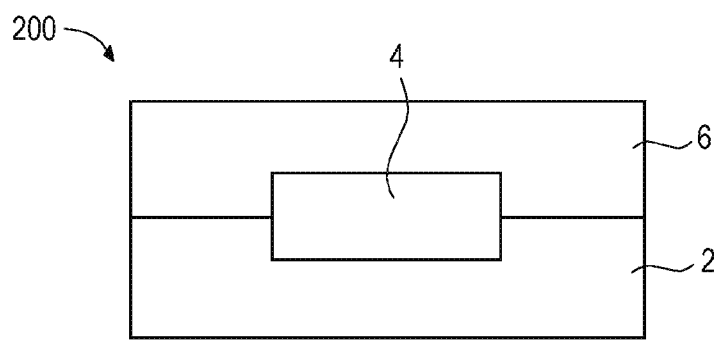
FIG. 2 schematically illustrates a cross-sectional side view of a semiconductor package 200 in accordance with the disclosure.

FIG. 2 schematically illustrates a cross-sectional side view of a semiconductor package 200 in accordance with the disclosure. The semiconductor package 200 is illustrated in a general manner in order to qualitatively specify aspects of the disclosure. The semiconductor package 200 may include further components which are not illustrated for the sake of simplicity. For example, the semiconductor package 200 may be extended by any of the aspects described in connection with other devices and methods in accordance with the disclosure.

The semiconductor package 200 includes a first preformed polymer form 2. The semiconductor package 200 further includes a second preformed polymer form 6 attached to the first preformed polymer form 2. The semiconductor package 200 further includes a semiconductor chip 4 arranged between the attached preformed polymer forms 2 and 6. The attached preformed polymer forms 2 and 6 form a semiconductor package 200 encapsulating the semiconductor chip 4. For example, the semiconductor package 200 may be manufactured based on the method of FIG. 1. In this regard, a semiconductor panel 100 may be manufactured as shown in FIGS. 1A to 1C. In a further act, the semiconductor panel 100 may be singulated into multiple semiconductor packages 200. The semiconductor panel 100 may be singulated by applying a dicing process including at least one of plasma dicing, ultrasonic mechanical dicing, laser dicing, etc.

According to an embodiment the semiconductor package 200 may further include a metallization material electrically coupled to an electrical contact of the semiconductor chip 4, wherein the metallization material may be manufactured by cold gas spraying. In particular, the metallization material may be made of or may include at least one of copper, aluminum, iron, nickel, alloys thereof. The sprayed metallization material may have a porosity smaller than about 50%, more particular smaller than about 40%, more particular smaller than about 30%, more particular smaller than about 20%, and even more particular smaller than about 10%. In one example the porosity may lie in a range from about 10% to about 50%.

According to an embodiment the semiconductor package 200 may further include an electrically conductive layer arranged between the preformed polymer forms 2 and 6. In particular, the electrically conductive layer may be a preformed metal sheet, such as e.g. a copper sheet or an aluminum sheet.

According to an embodiment at least one of the preformed polymer forms 2 and 6 may include at least one of a molding compound, a laminate, an epoxy, a filled epoxy, a glass fiber filled epoxy, an imide, a thermoplast, a thermoset polymer, a polymer blend. The preformed polymer forms 2 and 6 may be made of a similar or of a different material. In particular, the preformed polymer forms 2 and 6 may be prefabricated. That is, the preformed polymer forms 2 and 6 may be manufactured and formed in one or multiple acts before performing the acts of FIG. 1.

FIG. 3 includes FIGS. 3A to 3J schematically illustrating a cross-sectional side view of a method for manufacturing a semiconductor panel and a semiconductor package 300 in accordance with the disclosure. The manufactured semiconductor package 300 may be seen as a more detailed implementation of the semiconductor package 200 of FIG. 2. In addition, the method of FIG. 3 may be seen as a more detailed implementation of the method of FIG. 1.

Figure 3A:
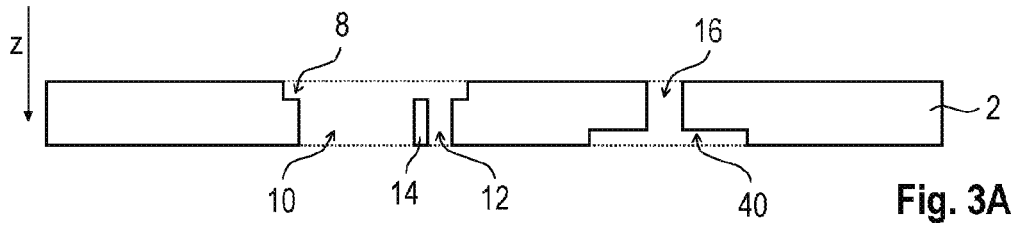
FIG. 3 includes FIGS. 3A to 3J schematically illustrating a cross-sectional side view of a method for manufacturing a semiconductor panel and a semiconductor package 300 in accordance with the disclosure.

In FIG. 3A, a first preformed polymer form 2 may be provided which is shown in a cross-sectional side view. The first preformed polymer form 2 may include a recess 8 in which a semiconductor chip may be arranged later on. In particular, when viewed in a z-direction (see arrow), an opening area of the recess 8 may be slightly larger than an area of a footprint of the semiconductor chip that is to be assembled. The first preformed polymer form 2 may further include a first through-hole 10 and an adjacent second through-hole 12 which may be separated by a separation structure 14. The through-holes 10 and 12 may extend from a bottom surface of the recess 8 to a bottom surface of the first preformed polymer form 2. The first preformed polymer form 2 may further include a recess 40 and a via hole 16. The via hole 16 may extend from a bottom surface of the recess 40 to an upper surface of the first preformed polymer form 2. As indicated by a dashed line in FIG. 3A, before forming the recesses and through-holes, the cross-sectional side view of the first preformed polymer form 2 may be substantially rectangular.

For illustrative purposes, FIG. 3A only shows a part or section of the first preformed polymer form 2. The first preformed polymer form 2 may be formed by multiple of such sections which may be periodically arranged to the left and to the right of the section shown in FIG. 3A. In addition, the sections may also be periodically arranged into or out of the drawing plane of FIG. 3A. The periodically arranged sections may form a single-piece (or integral) first preformed polymer form 2, wherein the recesses 8 may particularly form a rectangular and periodic grid structure when viewed in the z-direction (see arrow). The following description may refer to the section of FIG. 3A only, but may also hold true for additional sections which are not shown for the sake of simplicity.

Figure 3B:
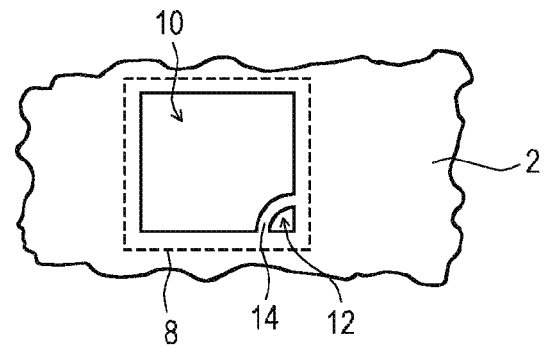

FIG. 3B illustrates a bottom view of the recess 8, the through-holes 10, 12 and the separation structure 14 of the first preformed polymer form 2 of FIG. 3A. The outline of the recess 8 is indicated by a dashed rectangle. The separation structure 14 may be arranged such that the opening area of the first though-hole 10 and the opening area of the second through-hole 12 may be similar to surface areas of electrical contacts of a semiconductor chip that is to be arranged in the recess 8. In the example of FIG. 3B, the separation structure 14 may be arc-shaped. In further examples, the separation structure 14 may be rectangular, polygonal, etc.

Figure 3C:
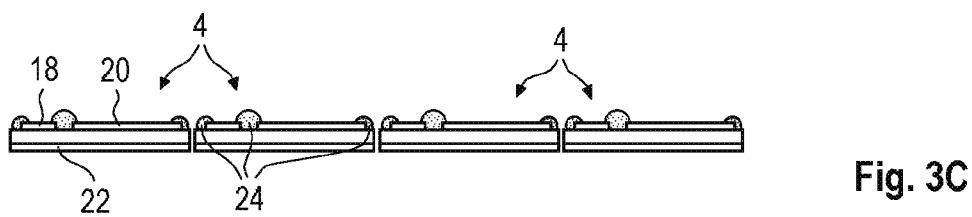

In FIG. 3C, multiple semiconductor chips 4 may be provided. The semiconductor chips 4 may have been diced from a semiconductor wafer in a foregoing act. The number of the semiconductor chips 4 is arbitrary and may particularly correspond to the number of recesses 8 in the first preformed polymer form 2. In the example of FIG. 3C, the semiconductor chips 4 may be power transistor chips having a vertical structure. Each of the semiconductor chips 4 may include a gate electrode 18 and a source electrode 20 arranged on an upper surface of the respective semiconductor chip 4. In addition, each of the semiconductor chips 4 may include a drain electrode 22 arranged on an opposite bottom surface of the respective semiconductor chip 4. In further examples, the semiconductor chips 4 may be of different type, for example power transistor chips having a lateral structure, power diode chips, etc. An adhesive material 24, such as e.g. glue, may be arranged at the outer edges of the upper surfaces of the semiconductor chips 4 as well as between the gate electrodes 18 and the source electrodes 20. For example, the adhesive material 24 may be printed to the upper surfaces of the semiconductor chips 4.

Figure 3D:
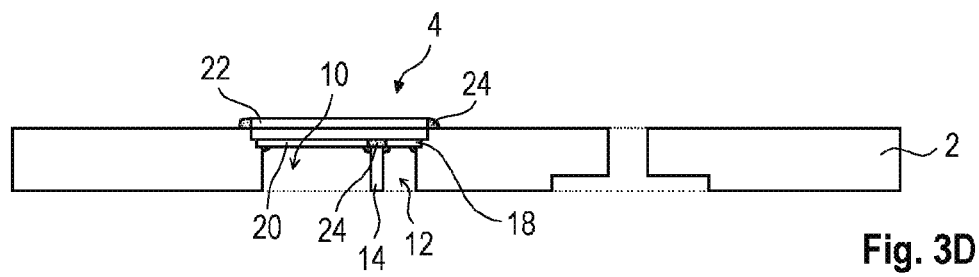

In FIG. 3D, the semiconductor chips 4 of FIG. 3C may be flipped and arranged in the recesses 8 of the first preformed polymer form 2. The adhesive material 24 may attach the outer edges of the semiconductor chip 4 to the edges of the bottom of the recess 8. In addition, the adhesive material 24 may attach the area between the gate electrode 18 and the source electrode 20 to the separation structure 14. The source electrode 20 may be arranged over the first through-hole 10, and the gate electrode 18 may be arranged over the second through-hole 12. After arranging the semiconductor chip 4, the adhesive material 24 may be cross-linked, in particular cured, in an optional further act.

Figure 3E:
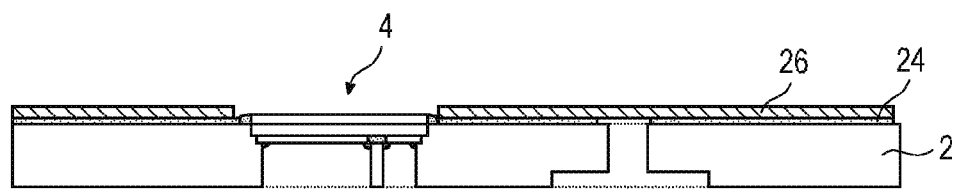

In FIG. 3E, an electrically conductive layer 26 may be arranged over the upper surface of the first preformed polymer form 2. In particular, the area over the semiconductor chip 4 may remain uncovered by the electrically conductive layer 26. In the example of FIG. 3E, the electrically conductive layer 26 may be a preformed metal sheet or a preformed metal alloy sheet, for example a sheet made of or including copper or aluminum. The metal sheet may be glued to the upper surface of the first preformed polymer form 2 by using an adhesive material 24 which may similar to the adhesive material 24 of FIG. 3D. In particular, the adhesive material 24 may be deposited over multiple sections of the first preformed polymer form 2 in a parallel act, for example by applying a printing technique.

Figure 3F:
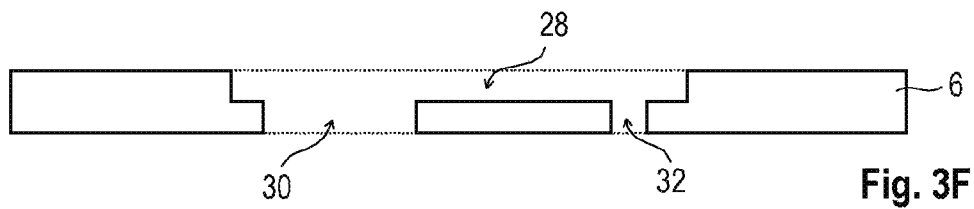

In FIG. 3F, a second preformed polymer form 6 may be provided which is shown in a cross-sectional side view. Similar to the first preformed polymer form 2 of FIG. 3A, only a part or section of the second preformed polymer form 6 is shown in FIG. 3F for illustrative purposes. The second preformed polymer form 6 may include multiple of such periodically arranged sections. The second preformed polymer form 6 may include a recess 28, a through-hole 30 and a via hole 32. The recess 28 may be formed in an upper surface of the second preformed polymer form 6. The through-hole 30 may extend from a bottom surface of the recess 28 to a bottom surface of the second preformed polymer form 6. In particular, the area of the footprint of the through-hole 30 may be similar to a surface area of the drain electrode 22 of the semiconductor chip 4 when viewed in the z-direction. The via hole 32 may also extend from a bottom surface of the recess 28 to a bottom surface of the second preformed polymer form 6. The via holes 16 and 32 of the first and second preformed polymer forms 2 and 6 may be substantially congruent when the preformed polymer forms 2 and 6 are arranged on top of each other. The same holds true for the through-holes of the preformed polymer forms 2 and 6.

Figure 3G:
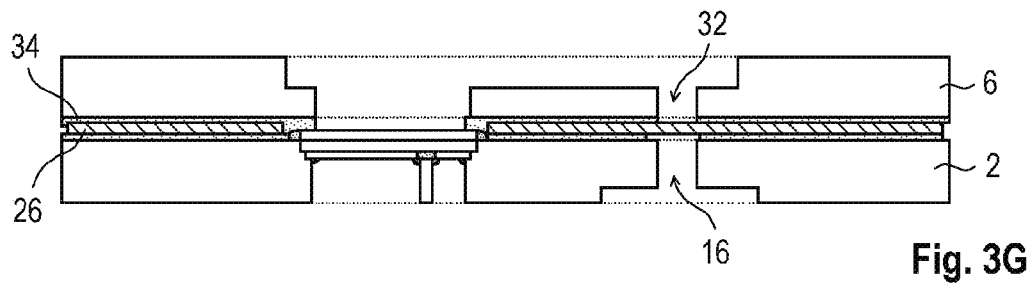

In FIG. 3G, an adhesive material 34, such as e.g. glue, may be arranged over the upper surface of the first preformed polymer form 2 and in particular over the upper surface of the electrically conductive layer 26. The area over the semiconductor chip 4 may remain uncovered by the adhesive material 34. In particular, the adhesive material 34 may be applied over multiple periodically arranged sections of the first preformed polymer form 2 in a parallel act, for example by applying a printing technique. After applying the adhesive material 34, the second preformed polymer form 6 may be attached to the first preformed polymer form 2. After the attachment, the via holes 16 and 32 of the first and second preformed polymer forms 2 and 6 may overlap and may be substantially congruent. The same holds true for the through-holes of the preformed polymer forms 2 and 6.

Figure 3H:
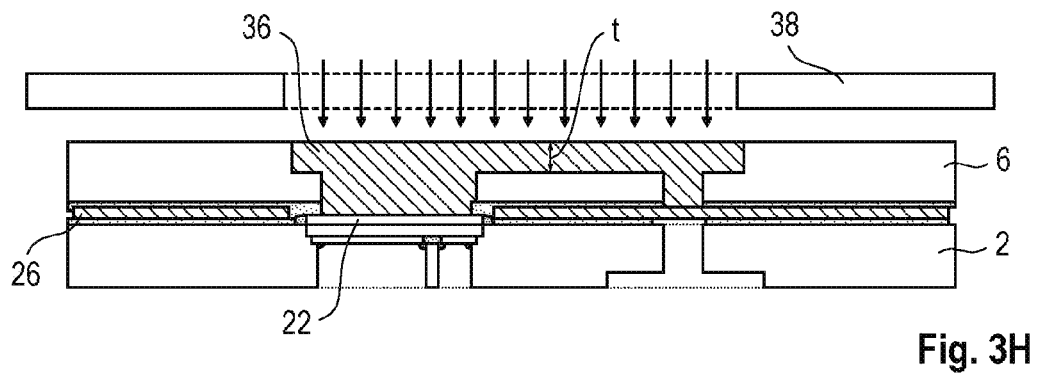

In FIG. 3H, a metallization material 36 may be deposited into the recess 28, into the through-hole 30 and into the via hole 32. In the example of FIG. 3H, the metallization material 36 may be copper which may be deposited by applying a cold gas spraying technique. Note that the metallization material 36 may be deposited in a parallel act over multiple sections of the second preformed polymer form 6. During the spraying process a hard mask 38 may be arranged over the upper surface of the second preformed polymer form 6 so that the deposited metallization material 36 may be structured and the upper surface may remain uncovered by the metallization material 36. In particular, the recess 28, the through-hole 30 and the via hole 32 may be completely filled by the metallization material 36. The deposited metallization material 36 may be in physical and electrical contact with the drain electrode 22 and the electrically conductive layer 26.

In a further act (not shown), material of at least one of the second preformed polymer form 6 and the metallization material 36 may be removed from the upper surface of the arrangement in order to obtain a planar upper surface. In particular, the upper surface of the second preformed polymer form 6 and the upper surface of the metallization material 36 may be arranged in a common plane after removing the material. For example, the material may be removed by applying at least one of grinding, chemical mechanical polishing, etching, milling, etc. A thickness t of the section of the electrically conductive material 36 arranged in the recess 28 between the through-hole 30 and the via hole 32 may lie in a range from about 15 micrometer to about 450 micrometer. In particular, the thickness t may be greater than about 100 micrometer, greater than about 200 micrometer, greater than about 300 micrometer, or greater than about 400 micrometer. Increasing the thickness t of the electrically conductive material 36 may improve heat dissipation and thus a cooling of the semiconductor package to be manufactured.

Figure 3I:
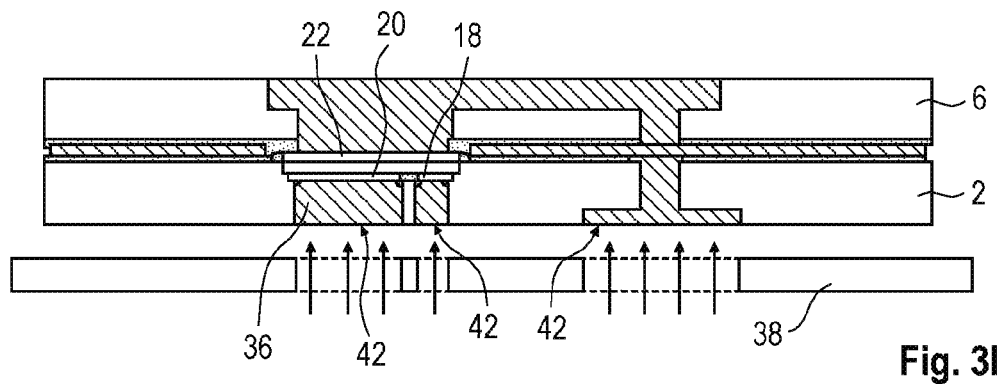

In FIG. 3I, a metallization material 36 may be deposited into the first through-hole 10, into the second through-hole 12, into the via hole 16 and into the recess 40. The metallization material 36 and the technique for applying the material may be similar to FIG. 3H. The bottom surfaces of the deposited metallization material 36 may correspond to landing pads 42 of the semiconductor package to be manufactured. The landing pads 42 may be contact pads configured to connect the semiconductor package to a circuit board later on. Note that the size of the landing pads 42, the form of the landing pads 42 and the distances between the landing pads 42 may be adaptable by choosing a corresponding size and form of the recesses in the first preformed polymer form 2. In the example of FIG. 3I, the gate electrode 18, the source electrode 20 and the drain electrode 22 may be accessible by contacting the landing pads 42 arranged on the bottom surface of the arrangement.

Figure 3J:
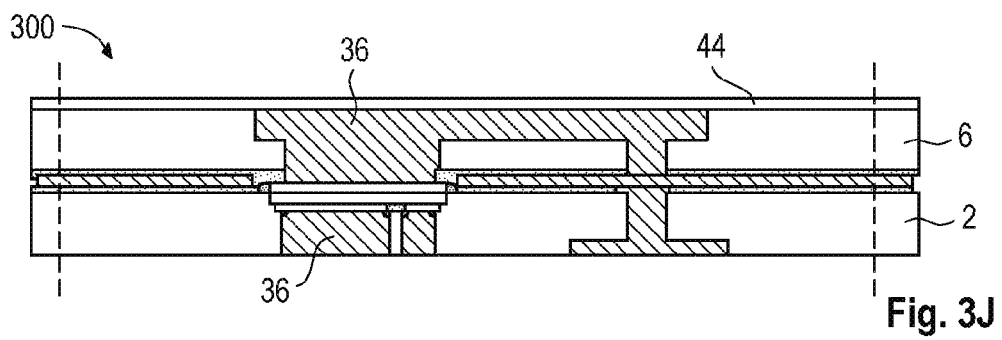

In FIG. 3J, an electrically insulating material 44 may be arranged over the upper surface of the arrangement in order to electrically insulate the electrically conductive material 36 from further electronic or conductive components. For example, the electrically insulating material 44 may be deposited in form of a layer. Note that the electrically insulating material 44 may be deposited in a parallel act over multiple sections of the semiconductor panel.

The method of FIG. 3 may include additional acts which are not specified in detail for the sake of simplicity. For example, the semiconductor panel of FIG. 3I may be singulated in multiple semiconductor packages 300 as indicated by dashed lines in FIG. 3I. In addition, the singulated semiconductor packages 300 may be arranged over a circuit board, wherein the landing pads 42 may face the circuit board and may provide an electrical and mechanical connection between the semiconductor package 300 and the circuit board.

Figure 4:
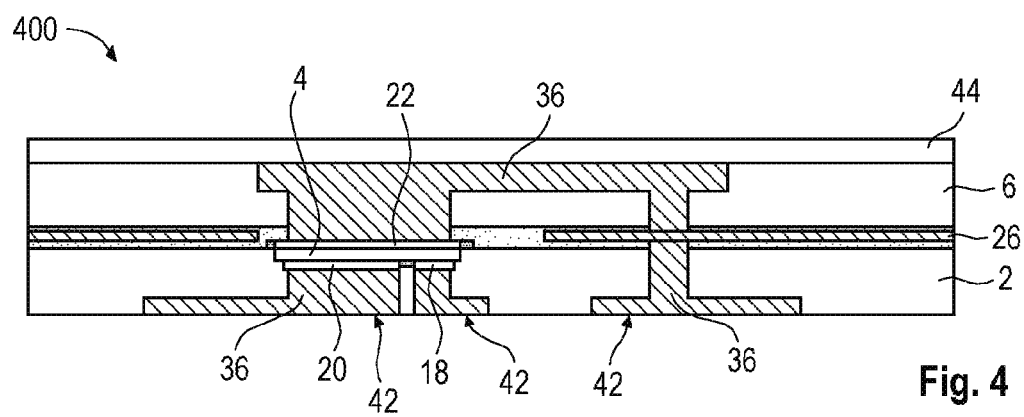
FIG. 4 schematically illustrates a cross-sectional side view of a semiconductor package 400 in accordance with the disclosure.
Figure 5:
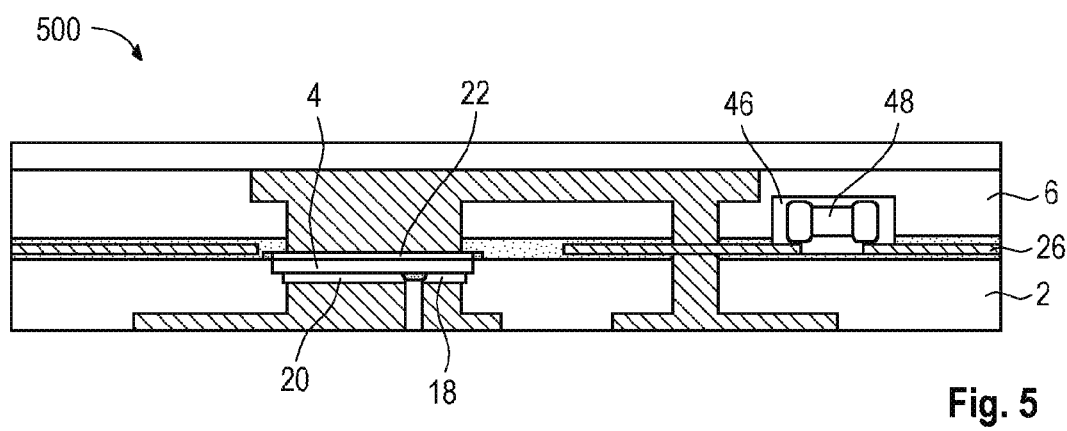
FIG. 5 schematically illustrates a cross-sectional side view of a semiconductor package 500 in accordance with the disclosure.

FIGS. 4 and 5 schematically illustrate cross-sectional side views of semiconductor packages 400 and 500 in accordance with the disclosure. The semiconductor packages 400 and 500 may be seen as more detailed implementations of the semiconductor package 200 of FIG. 2 and may be manufactured based on the method of FIG. 3.

The semiconductor package 400 of FIG. 4 may include a first preformed polymer form 2 and a second preformed polymer form 6 attached to the first preformed polymer form 2. A semiconductor chip 4 may be arranged between and may be encapsulated by the preformed polymer forms 2 and 6. In the example of FIG. 4, the semiconductor chip 4 may be a power transistor chip including a gate electrode 18 and a source electrode 20 arranged on a first surface of the semiconductor chip 4 as well as a drain electrode 22 arranged on an opposite second surface of the semiconductor chip 4. The electrodes of the semiconductor chip 4 may be redistributed to a bottom surface of the semiconductor package 400 via an electrically conductive material 36 extending through the preformed polymer forms 2 and 6. An electrically conductive layer 26 may be arranged between the preformed polymer forms 2 and 6. In addition, an electrically insulating layer 44 may be arranged over the upper surface of the semiconductor package 400. The semiconductor package 400 may be similar to the semiconductor package of FIG. 3J. In contrast to FIG. 3J, the landing pads 42 of the semiconductor package 400 may have an increased footprint area for connecting the semiconductor package 400 to a circuit board.

The semiconductor package 500 of FIG. 5 may be similar to the semiconductor package of FIG. 4. In contrast to FIG. 4, the semiconductor package 500 may further include a cavity 46 in which an electronic component 48 may be arranged. It is understood that the semiconductor packages of other examples described herein may also include one or more electronic components arranged in cavities similar to FIG. 5. In the example of FIG. 5, the cavity 46 may be formed by a recess in the second preformed polymer form 6. In further examples, the cavity 46 may also be formed by a recess in the first preformed polymer form 2 or recesses formed in both of the preformed polymer forms 2 and 6. The electronic component 48 may be electrically coupled to the semiconductor chip 4 via an electrically conductive layer 26. To provide such electrical coupling, the electrically conductive layer 26 may be structured in an additional act. In the example of FIG. 5, the electronic component 48 particularly may be electrically coupled to the drain electrode 22 of the semiconductor chip 4.

Figure 6:
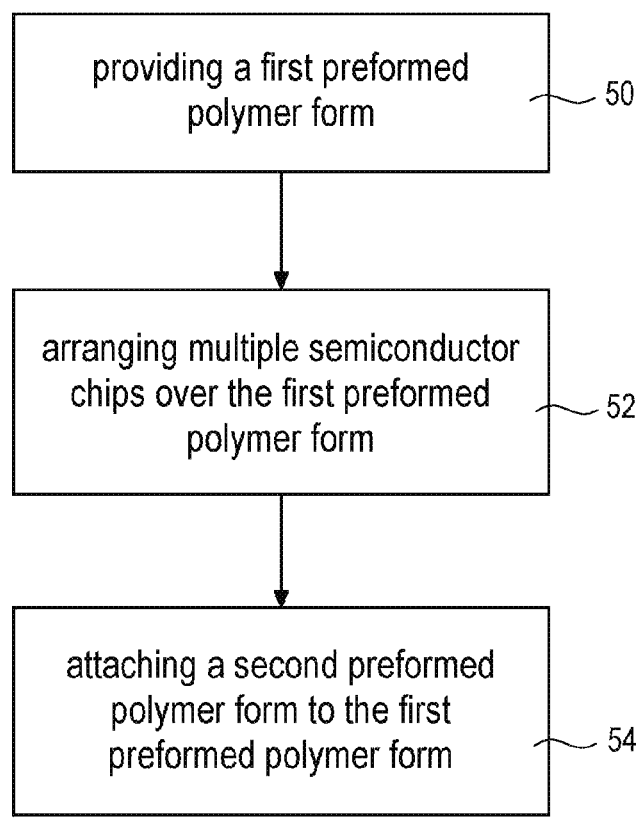
FIG. 6 illustrates a flowchart of a method for manufacturing a semiconductor panel in accordance with the disclosure.

FIG. 6 illustrates a flowchart of a method for manufacturing a semiconductor panel in accordance with the disclosure. The method may be similar to and may be read in connection with the method of FIG. 1.

At 50, a first preformed polymer form is provided. At 52, multiple semiconductor chips are arranged over the first preformed polymer form. At 54, a second preformed polymer form is attached to the first preformed polymer form. The semiconductor chips are arranged between the attached preformed polymer forms. The attached preformed polymer forms form the semiconductor panel encapsulating the semiconductor chips.

EXAMPLES

In the following, semiconductor panels and semiconductor packages as well as methods for manufacturing thereof will be explained by means of examples.

Example 1 is a method for manufacturing a semiconductor panel, the method comprising: providing a first preformed polymer form; arranging multiple semiconductor chips over the first preformed polymer form; and attaching a second preformed polymer form to the first preformed polymer form, wherein the semiconductor chips are arranged between the attached preformed polymer forms, and wherein the attached preformed polymer forms form the semiconductor panel encapsulating the semiconductor chips.

Example 2 is a method according to Example 1, wherein arranging the semiconductor chips comprises: arranging the semiconductor chips in multiple recesses of the first preformed polymer form.

Example 3 is a method according to Example 1 or 2, wherein arranging the semiconductor chips comprises: arranging electrical contacts of the semiconductor chips over through-holes of the first preformed polymer form.

Example 4 is a method according to Example 3, wherein arranging the electrical contacts comprises: arranging a first electrical contact of a semiconductor chip over a first through-hole, and arranging a second electrical contact of the semiconductor chip over a second through-hole adjacent to the first through-hole, wherein the first through-hole and the second through-hole are separated by a separation structure.

Example 5 is a method according to one of the preceding Examples, wherein attaching the second preformed polymer form comprises: arranging through-holes of the second preformed polymer form over electrical contacts of the semiconductor chips.

Example 6 is a method according to one of the preceding Examples, further comprising: depositing a metallization material into through-holes of at least one of the preformed polymer forms, wherein the deposited metallization material is electrically coupled to electrical contacts of the semiconductor chips.

Example 7 is a method according to Example 6, wherein depositing the metallization material comprises: cold gas spraying at least one of a metal and a metal alloy into the through-holes.

Example 8 is a method according to Example 6 or 7, further comprising: partly removing at least one of the preformed polymer forms and the metallization material, wherein a surface of at least one of the preformed polymer forms and a surface of the metallization material are arranged in a common plane after the removing.

Example 9 is a method according to one of Examples 6 to 8, wherein the first preformed polymer form comprises a first via hole extending through the first preformed polymer form, the second preformed polymer form comprises a second via hole extending through the second preformed polymer form, attaching the second preformed polymer form comprises providing an overlap between the first via hole and the second via hole, and the deposited metallization material forms an electrical via connection extending through the semiconductor panel.

Example 10 is a method according to one of the preceding Examples, further comprising: before attaching the second preformed polymer form, arranging an electrically conductive layer over the first preformed polymer form, wherein the electrically conductive layer is arranged between the preformed polymer forms.

Example 11 is a method according to one of the preceding Examples, further comprising: forming at least one recess in at least one of the preformed polymer forms, and arranging an electronic component in the at least one recess, wherein the electronic component is encapsulated in the semiconductor panel.

Example 12 is a method according to Example 11, wherein the electronic component is electrically coupled to one of the semiconductor chips via the electrically conductive layer.

Example 13 is a method according to one of the preceding Examples, wherein the semiconductor chips comprise power semiconductor chips.

Example 14 is a method according to one of the preceding Examples, further comprising: structuring at least one of the preformed polymer forms, wherein the structuring comprises at least one of molding, milling, grinding, laser drilling.

Example 15 is a method according to one of the preceding Examples, wherein the semiconductor panel is of rectangular shape, and a surface area of the rectangular semiconductor panel is greater than or equal to 300 mm×300 mm.

Example 16 is a semiconductor package, comprising: a first preformed polymer form; a second preformed polymer form attached to the first preformed polymer form; and a semiconductor chip arranged between the attached preformed polymer forms, wherein the attached preformed polymer forms form a semiconductor package encapsulating the semiconductor chip.

Example 17 is a semiconductor package according to Example 16, further comprising: a metallization material electrically coupled to an electrical contact of the semiconductor chip, wherein the metallization material is manufactured by cold gas spraying.

Example 18 is a semiconductor package according to Example 16 or 17, further comprising: an electrically conductive layer arranged between the preformed polymer forms.

Example 19 is a semiconductor package according to one of Examples 16 to 18, wherein at least one of the preformed polymer forms comprises at least one of a molding compound, a laminate, an epoxy, a filled epoxy, a glass fiber filled epoxy, an imide, a thermoplast, a thermoset polymer, a polymer blend.

Example 20 is a method for manufacturing a semiconductor package, the method comprising: manufacturing a semiconductor panel according to one of Examples 1 to 15; and singulating the semiconductor panel into multiple semiconductor packages.

As employed in this description, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Furthermore, to the extent that the terms "having", "containing", "including", "with" or variants thereof are used in either the detailed description or the claims, such terms are intended to be inclusive in a manner similar to the term "comprising". That is, as used herein, the terms "having", "containing", "including", "with", "comprising" and the like are open-ended terms that indicate the presence of stated elements or features, but do not preclude additional elements or features.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

The invention claimed is:

1. A method for manufacturing a semiconductor panel, the method comprising:
   providing a first preformed polymer form;
   arranging multiple semiconductor chips over the first preformed polymer form in multiple recesses of the first preformed polymer form; and
   attaching a second preformed polymer form to the first preformed polymer form,
   wherein the semiconductor chips are arranged between the attached preformed polymer forms, and
   wherein the attached preformed polymer forms form the semiconductor panel encapsulating the semiconductor chips.

2. The method of claim 1, wherein arranging the semiconductor chips comprises:
   arranging electrical contacts of the semiconductor chips over through-holes of the first preformed polymer form.

3. The method of claim 2, wherein arranging the electrical contacts comprises:
   arranging a first electrical contact of a semiconductor chip over a first through-hole, and
   arranging a second electrical contact of the semiconductor chip over a second through-hole adjacent to the first through-hole,
   wherein the first through-hole and the second through-hole are separated by a separation structure.

4. The method of claim 1, further comprising:
   depositing a metallization material into through-holes of at least one of the preformed polymer forms, wherein the deposited metallization material is electrically coupled to electrical contacts of the semiconductor chips.

5. The method of claim 4, wherein depositing the metallization material comprises:
   cold gas spraying at least one of a metal and a metal alloy into the through-holes.

6. The method of claim 4, further comprising:
   partly removing at least one of the preformed polymer forms and the metallization material, wherein a surface of at least one of the preformed polymer forms and a surface of the metallization material are arranged in a common plane after the removing.

7. The method of claim 4, wherein
   the first preformed polymer form comprises a first via hole extending through the first preformed polymer form,
   the second preformed polymer form comprises a second via hole extending through the second preformed polymer form,
   attaching the second preformed polymer form comprises providing an overlap between the first via hole and the second via hole, and
   the deposited metallization material forms an electrical via connection extending through the semiconductor panel.

8. The method of claim 1, wherein the semiconductor chips comprise power semiconductor chips.

9. The method of claim 1, further comprising:
structuring at least one of the preformed polymer forms, wherein the structuring comprises at least one of molding, milling, grinding, laser drilling.

10. The method of claim 1, wherein the semiconductor panel is of rectangular shape, and a surface area of the rectangular semiconductor panel is greater than or equal to 300 mm×300 mm.

11. A method for manufacturing a semiconductor package, the method comprising:
manufacturing a semiconductor panel according to claim 1; and
singulating the semiconductor panel into multiple semiconductor packages.

12. A method for manufacturing a semiconductor panel, the method comprising:
providing a first preformed polymer form;
arranging multiple semiconductor chips over the first preformed polymer form; and
attaching a second preformed polymer form to the first preformed polymer form,
wherein the semiconductor chips are arranged between the attached preformed polymer forms,
wherein the attached preformed polymer forms form the semiconductor panel encapsulating the semiconductor chips, and
wherein attaching the second preformed polymer form comprises arranging through-holes of the second preformed polymer form over electrical contacts of the semiconductor chips.

13. The method of claim 12, further comprising:
depositing a metallization material into the through-holes, wherein the deposited metallization material is electrically coupled to electrical contacts of the semiconductor chips.

14. The method of claim 12, wherein arranging the semiconductor chips comprises:
arranging the semiconductor chips in multiple recesses of the first preformed polymer form.

15. A method for manufacturing a semiconductor panel, the method comprising:
providing a first preformed polymer form;
arranging multiple semiconductor chips over the first preformed polymer form;
attaching a second preformed polymer form to the first preformed polymer form; and
before attaching the second preformed polymer form, arranging an electrically conductive layer over the first preformed polymer form, wherein the electrically conductive layer is arranged between the preformed polymer forms,
wherein the semiconductor chips are arranged between the attached preformed polymer forms, and
wherein the attached preformed polymer forms form the semiconductor panel encapsulating the semiconductor chips.

16. The method of claim 15, further comprising:
forming at least one recess in at least one of the preformed polymer forms, and
arranging an electronic component in the at least one recess, wherein the electronic component is encapsulated in the semiconductor panel.

17. The method of claim 16, wherein the electronic component is electrically coupled to one of the semiconductor chips via the electrically conductive layer.

18. A semiconductor package, comprising:
a first preformed polymer form;
a second preformed polymer form attached to the first preformed polymer form;
a semiconductor chip arranged between the attached preformed polymer forms; and
an electrically conductive layer arranged between the preformed polymer forms,
wherein the attached preformed polymer forms form a semiconductor package encapsulating the semiconductor chip.

19. The semiconductor package of claim 18, further comprising:
a metallization material electrically coupled to an electrical contact of the semiconductor chip, wherein the metallization material is manufactured by cold gas spraying.

20. The semiconductor package of claim 18, wherein at least one of the preformed polymer forms comprises at least one of a molding compound, a laminate, an epoxy, a filled epoxy, a glass fiber filled epoxy, an imide, a thermoplast, a thermoset polymer, a polymer blend.

* * * * *